(12) United States Patent
Cai et al.

(10) Patent No.: US 8,044,305 B2
(45) Date of Patent: Oct. 25, 2011

(54) CIRCUIT BOARD INCLUDING HYBRID VIA STRUCTURES

(75) Inventors: Xingjian Cai, Gilbert, AZ (US); Ke Wang, Laveen, AZ (US); Qing-lun Chen, El Dorado Hill, CA (US)

(73) Assignee: Intel Corporation, Santa Clara, CA (US)

( * ) Notice: Subject to any disclaimer, the term of this patent is extended or adjusted under 35 U.S.C. 154(b) by 1493 days.

(21) Appl. No.: 11/443,763

(22) Filed: May 31, 2006

(65) Prior Publication Data

US 2007/0279878 A1 Dec. 6, 2007

(51) Int. Cl.
*H05K 1/16* (2006.01)
(52) U.S. Cl. ......................... 174/260; 174/262
(58) Field of Classification Search ............... 174/260, 174/261, 262
See application file for complete search history.

(56) References Cited

U.S. PATENT DOCUMENTS

| | | | | |
|---|---|---|---|---|
| 6,972,382 B2 * | 12/2005 | Zollo et al. | ..................... | 174/262 |
| 7,069,646 B2 * | 7/2006 | Duxbury et al. | ................ | 29/830 |
| 7,239,526 B1 * | 7/2007 | Bibee | ........................... | 361/788 |
| 2005/0023241 A1 * | 2/2005 | Goergen | ........................ | 216/13 |
| 2005/0201065 A1 * | 9/2005 | Regnier et al. | ................ | 361/720 |

OTHER PUBLICATIONS

Ajanovic et al., "PCI Express Base Specification Revision 1.0a", PCI Express™, PCI-SIG, Apr. 15, 2003, pp. 1-428.
"Blade Server Base Specification for Switch Module Subsystems", Version 2.07, IBM/Intel Confidential, Sep. 7, 2006, pp. 1-102.
"PICMG3.0 Short Form Specification", Advanced TCA™ PCI Industrial Computers Manufacturers Group, Jan. 2003, 34 pages.
"CompactPCI" Short Form Specification, PCI Industrial Computers Manufacturers Group, Nov. 1, 1995. pp. 1-6.

* cited by examiner

*Primary Examiner* — Ishwarbhai Patel
(74) *Attorney, Agent, or Firm* — Grossman, Tucker, Perreault & Pfleger, PLLC

(57) ABSTRACT

A circuit board may include hybrid via structures configured to connect to components, such as connectors and electronic components, mounted on the circuit board. A hybrid via structure may include one or more micro-vias configured to provide an electrical connection to a signal trace in the circuit board and one or more through-vias configured to provide a ground connection to at least one reference plane in the circuit board. In one embodiment, a plurality of circuit boards including the hybrid via structures and signal traces may be connected to establish a channel supporting differential signaling and data transfer rates of at least about 5 Gb/s. Of course, many alternatives, variations, and modifications are possible without departing from this embodiment.

14 Claims, 5 Drawing Sheets

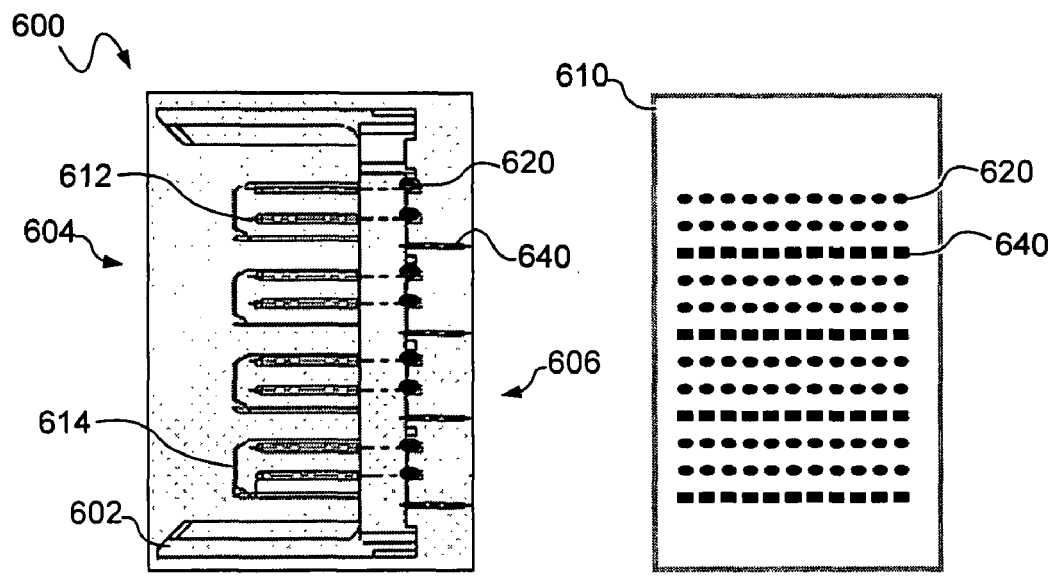
FIG. 6A  FIG. 6B
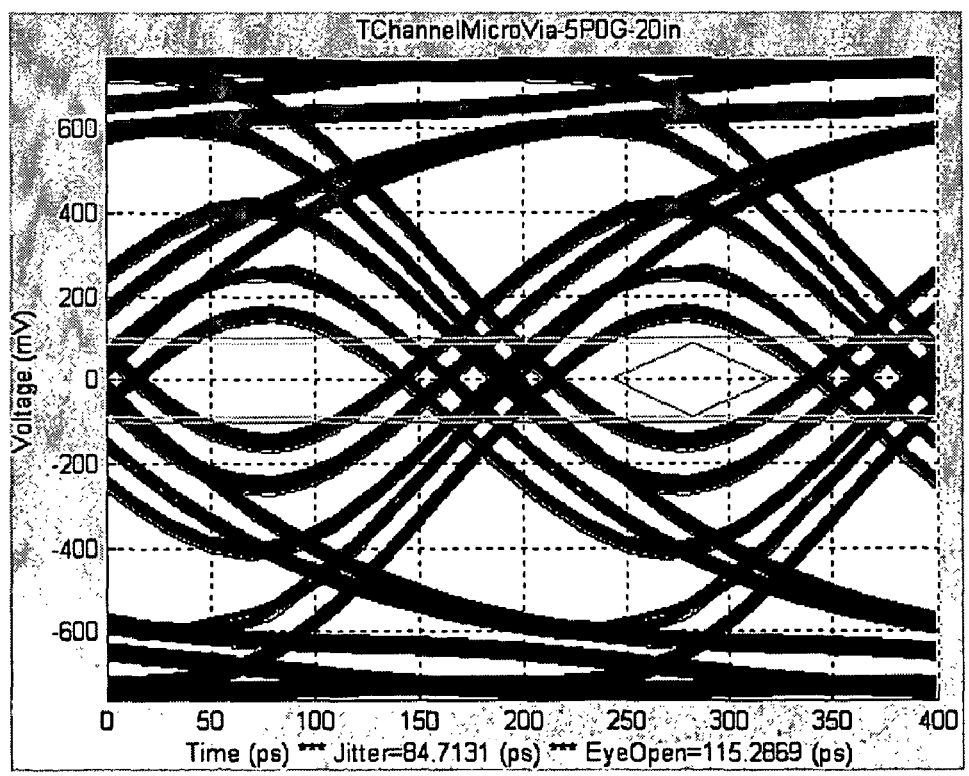
FIG. 7

CIRCUIT BOARD INCLUDING HYBRID VIA STRUCTURES

FIELD

The present disclosure relates to circuit boards including via structures, and more particularly, relates to circuit boards including hybrid via structures with through-vias for grounding and micro-vias for signals.

BACKGROUND

In a computer system, a plurality of circuit boards may be connected to establish one or more communication channels. In an Advanced Telecommunications Computer Architecture (ATCA) system, for example, a plurality of circuit boards (also referred to as blades) may be coupled to and interconnected via a common backplane within a shelf or chassis. Electronic components (e.g., chip packages) and connectors may be mounted to the circuit boards. The circuit boards may include conductive paths that electrically connect the electronic components and/or connectors. The conductive paths may include traces that extend along the circuit board and vias that connect the traces to the electronic components and/or connectors mounted on the circuit board. The traces may include signal traces that carry data signals between the electronic components.

Modern communications systems may establish high-speed channels having data rates that approach several giga-bits per second (Gb/s) using differential signaling techniques. In such systems, the existing via structures in the circuit boards (e.g., in an 18 layer ATCA backplane) may degrade the high-speed channel performance. This degradation may cause a high-speed channel to fail despite the use of signaling techniques that improve signaling performance, such as de-emphasis in a transmitter buffer and/or equalization in a receiver buffer. The degradation is especially problematic when vias extending through the circuit board (referred to as through-vias) are connected to traces in top signal layers of the circuit board, leaving an unused portion of the via (referred to as a stub) that adversely affects signal integrity. To recover signal quality caused by discontinuity in the vias, an equalization technique may be applied at the circuit level but may be complicated and expensive to implement. One technique for removing the stub includes back drilling the via, which requires an additional manufacturing step and is expensive.

BRIEF DESCRIPTION OF DRAWINGS

Features and advantages of the claimed subject matter will be apparent from the following detailed description of embodiments consistent therewith, which description should be considered with reference to the accompanying drawings, wherein:

FIG. 6A is a side view of a connector that may be used with a circuit board including hybrid via structures, consistent with one embodiment of the present disclosure;

FIG. 6B is a rear view of the connector shown in FIG. 6A; and

FIG. 7 is an eye diagram illustrating an eye pattern of a signal through a hybrid via structure, consistent with one embodiment of the present disclosure;

Although the following Detailed Description will proceed with reference being made to illustrative embodiments, many alternatives, modifications, and variations thereof will be apparent to those skilled in the art. Accordingly, it is intended that the claimed subject matter be viewed broadly.

DETAILED DESCRIPTION

Figure 1:
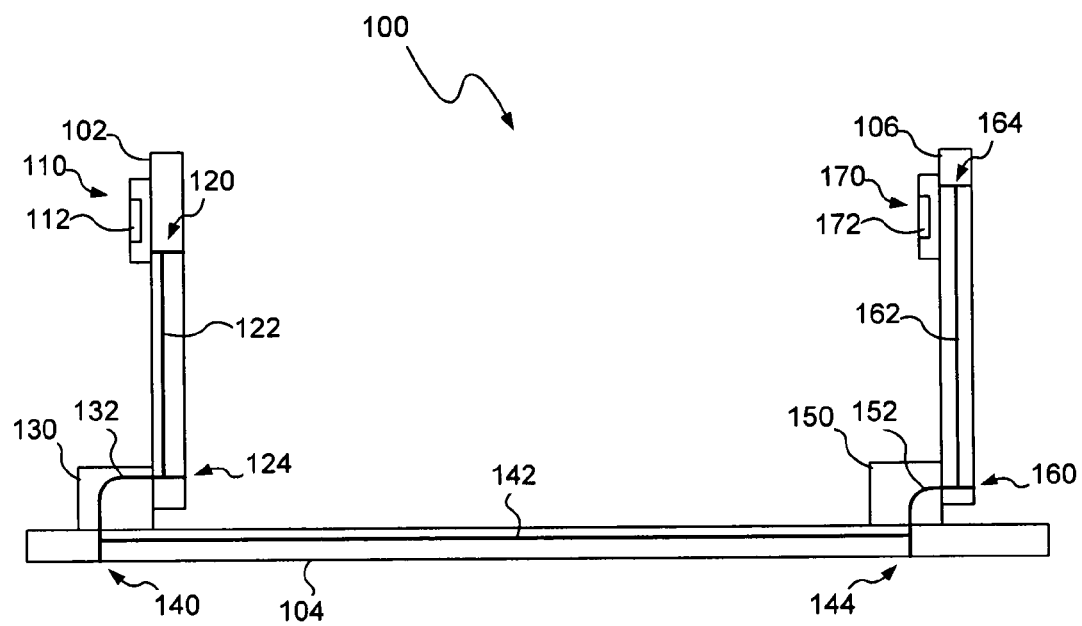
FIG. 1 is a schematic view of circuit boards connected to provide a channel in a communication system, consistent with one embodiment of the present disclosure.

Referring to FIG. 1, a computer system 100 may include circuit boards 102, 104, 106 connected to establish one or more communication channels, such as a high speed channel in a high speed communication system. To establish the channel(s), the circuit boards 102, 104, 106 may include conductive paths such as traces 122, 142, 162 and via structures 120, 124, 140, 144, 160, 164. Via structures 120, 124, 140, 144, 160, 164 may extend into the circuit boards 102, 104, 106 and electrically connect the traces 122, 142, 162 to components coupled to the circuit boards 102, 104, 106. One or more of the, via structures 120, 124, 140, 144, 160, 164 may be hybrid via structures including one or more through-vias that provide a ground connection and one or more micro-vias that provide a signal connection, as will be described in greater detail below. Although one trace and two via structures are shown schematically in each of the circuit boards 102, 104, 106 to establish a single channel, those skilled in the art will recognize the circuit boards 102, 104, 106 may include any number of traces and via structures to establish multiple channels.

One or more electronic components 110, 170 may be mounted to one or more of the circuit boards 102, 106 and electrically connected to via structures 120, 164. The electronic components 110, 170 may transmit and receive signals over the communication channel. One or more connectors 130, 150 may be coupled to one or more of the circuit boards 102, 104, 106 and electrically connected to via structures 124, 140, 144, 160. The connectors 130, 150 may connect the circuit boards 102, 104, 106 to each other and may include connector conductive paths 132, 152 that provide an electrical connection between the circuit boards 102, 104, 106. Those skilled in the art will recognize that other components or devices may also be coupled to the circuit boards 102, 104, 106 and electrically connected to via structures.

In one embodiment, at least one circuit board 104 may be a motherboard or backplane connected to other circuit boards 102, 106, such as line cards that interface with telecommunications lines. The connectors 130, 150 may include mating connectors, such as data transport connectors, mounted on each of the circuit boards 102, 104, 106, for example, such that the line cards may be connected to the backplane. In one example, the traces 122, 162 may extend at least about two (2) inches in the circuit boards 102, 106 and the trace 142 may extend at least about twenty (20) inches in the backplane circuit board 104. The electronic components 110, 170 may be chip packages including, for example, a transmitter chip 112 and a receiver chip 172. Signals may be transmitted over the channel (e.g., between the transmitter chip 112 and receiver chip 172) using differential signaling such as low voltage differential signaling (LVDS). In one embodiment, the channel may support 5 Gb/s PCI Express Gen. 2 signaling that is compatible with or complies with Peripheral Component Interconnect (PCI) Express Base Specification Revision 1.1a, published on Apr. 15, 2003 (the "PCI Express Specification").

The computer system 100 may be implemented in an advanced telecommunications computing architecture (Advanced TCA or ATCA) complying with or compatible with, at least in part, PCI Industrial Computer Manufacturers Group (PICMG), Advanced Telecommunications Computing Architecture (ATCA) Base Specification, PICMG 3.0 Rev. 2.0, published Mar. 18, 2005, and/or later versions of the specification ("the ATCA specification"). According to such an embodiment, the circuit boards 102, 106 may be ATCA blades and the circuit board 104 may be an ATCA backplane complying with or compatible with, at least in part, the ATCA Specification.

Various other embodiments consistent with the present disclosure may include circuit boards complying with and/or compatible with technical specifications other than and/or in addition to the ATCA Specification. Circuit boards may be used, for example, in other types of chassis or systems such as a VME chassis, a CompactPCI chassis, or an IBM BladeCenter®. The scope of the present disclosure should not, therefore, be construed as being limited to any particular computer system or form factor.

Figure 2:
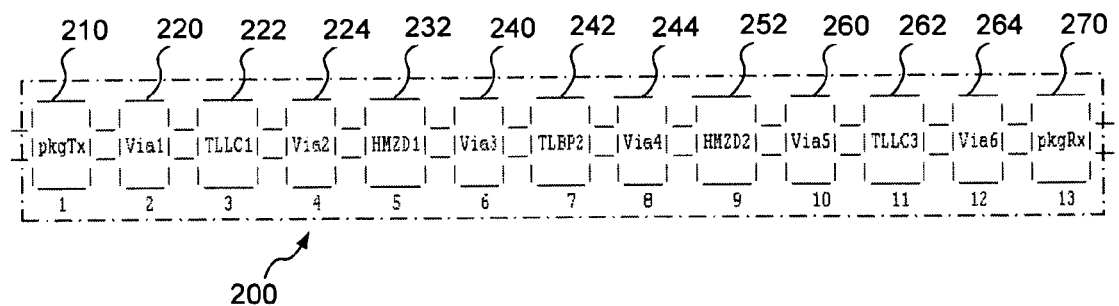
FIG. 2 is a diagrammatic view of the passive components of a channel in the system shown in FIG. 1, which uses differential signaling.

FIG. 2 is a diagrammatic illustration of the passive components of a channel 200 in the computer system 100 in FIG. 1, which uses differential signaling. The channel 200 may include a transmitter 210 to transmit a differential signal and a receiver 270 to receive the differential signal. The channel 200 may include a first via structure 220, a first line card trace 222, a second via structure 224, a first connector path 232, a third via structure 240, a backplane trace 242, a fourth via structure 244, a second connector path 252, a fifth via structure 260, a second line card trace 262, and a sixth via structure 264. In this exemplary embodiment, therefore, six (6) via structures 220, 224, 240, 244, 260, 264 are used to establish the channel 200. To carry differential signals, the traces 222, 242, 262 may include differential pairs of traces and the via structures 220, 224, 240, 244, 260, 264 may be hybrid via structures including differential pairs of micro-vias.

Figure 3A:
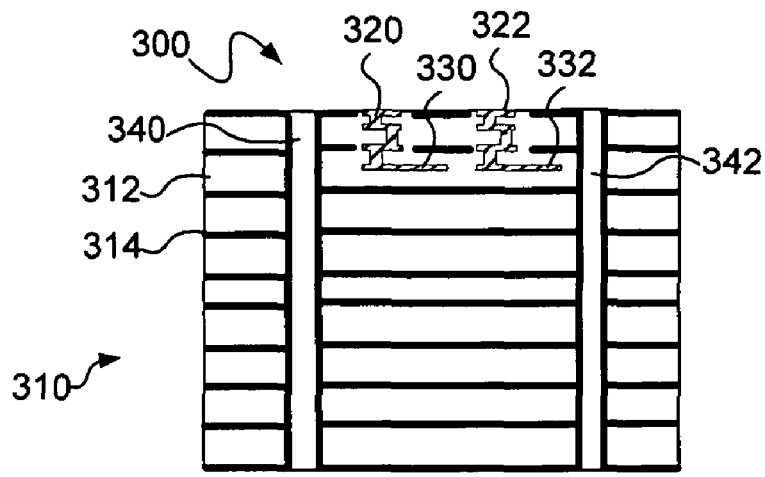
FIG. 3A is a side partially cross-sectional view of one embodiment of a hybrid via structure in a circuit board.
Figure 3B:
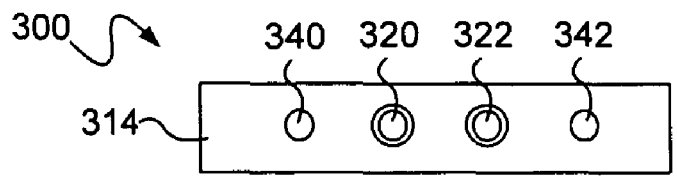
FIG. 3B is a top view of the hybrid via structure shown in FIG. 3A.
Figure 3C:
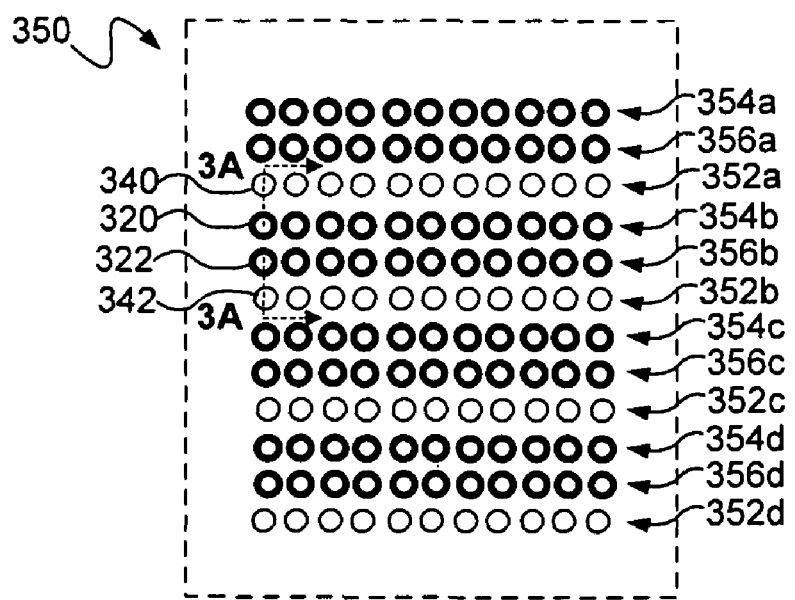
FIG. 3C is a top view of a group of hybrid via structures on a circuit board for connection to a component, consistent with one embodiment of the present disclosure.

Referring to FIGS. 3A-3C, a hybrid via structure 300 may be used in a circuit board 310 to establish a connection to components, such as connectors and/or electronic components (not shown), mounted on the circuit board 310. The circuit board 310 may include a plurality of circuit board layers 312, 314. An ATCA backplane, for example, may include eighteen (18) layers. In one embodiment, circuit board layers may include signal layers 312 and reference layers 314, as is known to those skilled in the art. The signal layers 312 may include a dielectric material and a conductive material (e.g., copper) embedded within the dielectric material to form signal traces. The reference layers 314 may include a plane of conductive material (e.g., copper) extending between the dielectric material of the signal layers 312 to provide power or ground paths. Those skilled in the art will recognize that various multi-layer circuit board designs may be used.

The hybrid via structure 300 may include a combination of one or more micro-vias 320, 322 for connecting to signal traces 330, 332 and one or more through-vias 340, 342 for connecting to one or more reference layers 314. In an embodiment using differential signaling, each hybrid via structure 300 may include a pair of micro-vias 320, 322 connected to a pair of signal traces 330, 332 (e.g., copper traces in a signal layer 312). As used herein, a micro-via is a conductive path that extends through one or more circuit board layers to the target signal layer including the signal trace to which the micro-via is connected but does not extend beyond the target signal layer. As used herein, a through-via is a conductive path extending through the circuit board layers from one side to another side of a circuit board (e.g., a plated through hole).

In the illustrated embodiment, the signal traces 330, 332 are located in the top second signal layer 312 of the circuit board 310. The micro-via structures 320, 322 may also extend further into the circuit board 310 to connect with signal traces in other signal layers of the circuit board 310. The through-vias 340, 342 may be connected to one or more of the reference layers 314, for example, to provide a ground connection.

As shown in FIG. 3C, a plurality of hybrid via structures 300 may form a connection region 350 on a circuit board, which is configured to be connected to a component such as an electronic component or a connector. The connection region 350 may include single rows 352a-d of through-vias 340, 342 located between two rows 354a-d, 356a-d of micro-vias 320, 322. The rows 354a-d, 356a-d of micro-vias 320, 322 and the rows 352a-d of through-vias 340 are arranged to connect with connection pads and pins on a component, such as a connector, as described in greater detail below.

Figure 4:
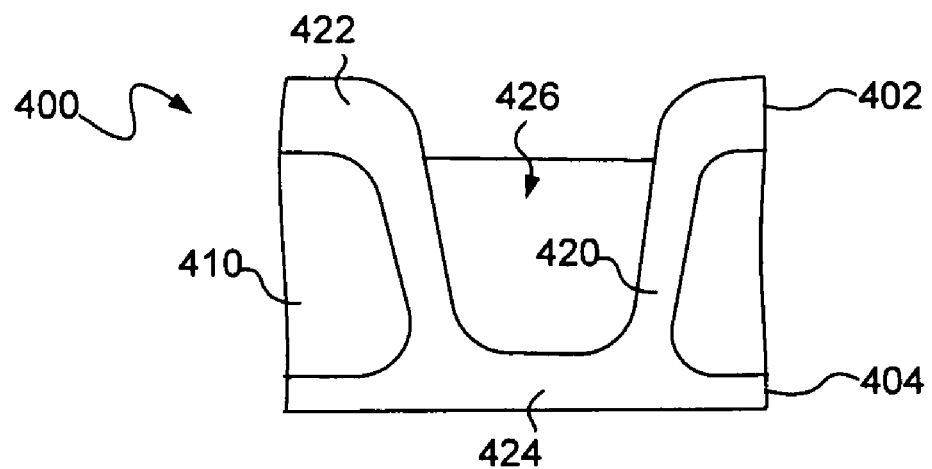
FIG. 4 is a side cross-sectional view of one embodiment of a micro-via that may be used in a hybrid via structure.
Figure 5:
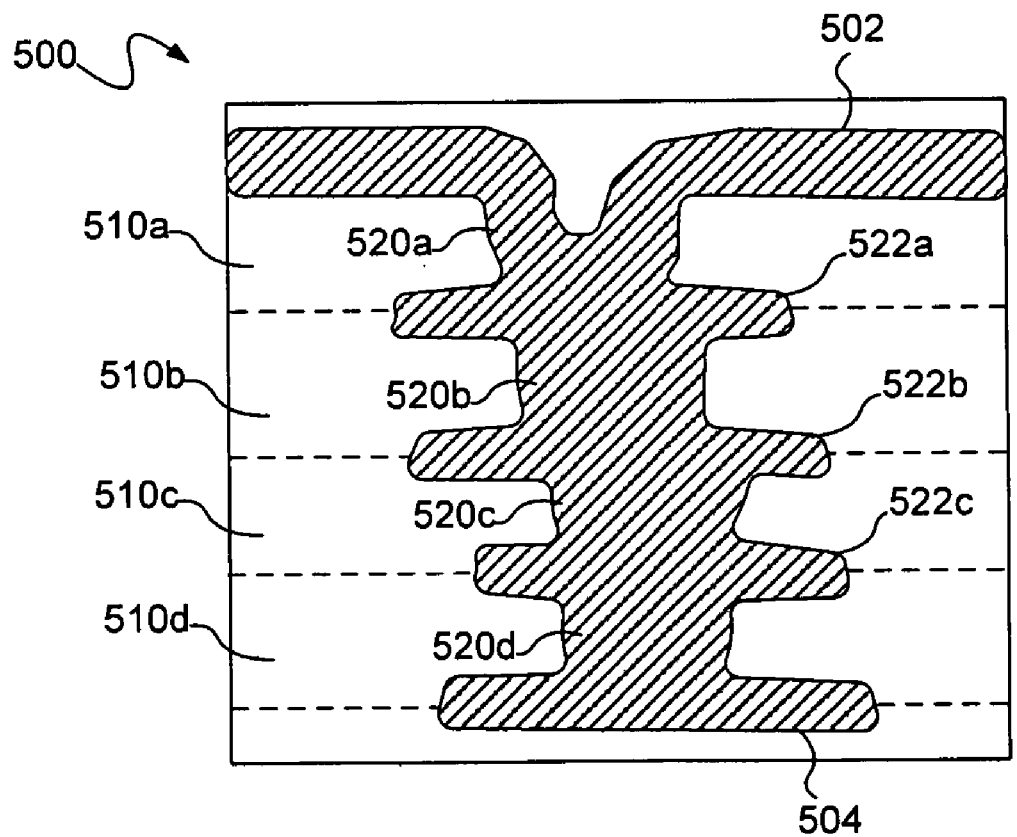
FIG. 5 is a side cross-sectional view of one, embodiment of a stacked micro-via that may be used in a hybrid via structure.

Referring to FIGS. 4 and 5, embodiments of micro-vias and the construction thereof are described in greater detail. FIG. 4 shows a micro-via 400 between two neighboring metal layers 402, 404 in a circuit board layer 410. The micro-via 400 may include a side portion 420 extending through the circuit board layer 410, a top portion 422, and a bottom portion 424. The micro-via 400 thus provides conductivity between the neighboring metal layers 402, 404. The micro-via 400 may thus connect to a trace or to another micro-via in stacked configuration, as described below.

The micro-via 400 may be manufactured using processes known to those skilled in the art. In one embodiment, the micro-via 400 may be constructed by forming a hole 426 in the circuit board layer 410, for example, using a UV or $CO_2$ laser drilling process. The hole 426 may be plated with a conductive material, such as copper or another conductive metal, to form the side portion 420, top portion 422 and bottom portion 424 of the micro-via 400. The micro-via 400 may then be filled, for example, with a conductive material.

FIG. 5 shows a stacked micro-via 500 formed by a plurality of micro-vias 520a-d in a plurality of circuit board layers 510a-d. The stacked micro-via 500 may provide conductivity from a metal layer 502 (e.g., at the top of a circuit board) through the plurality of circuit board layers 510a-d to another metal layer 504 (e.g., a trace) within a circuit board.

The stacked micro-via 500 may be constructed layer-by-layer from a core layer (e.g., layer 510d) up to a top layer (e.g., layer 510a) or down to a bottom layer (not shown). According to one embodiment, the individual micro-vias 520a-d may be constructed by metal plating holes formed in each of the layers 510a-d, for example, as described above, and by filling the metal plated holes with metal. The micro-vias 520a-d are aligned and constructed such that portions 522a-c of micro-vias 520*a-d* in adjacent layers are connected. The stacked micro-via 500 may include micro-vias 520*a-d* stacked generally in an "in-line" configuration, for example, as shown in FIG. 5. Alternatively, a stacked micro-via may include micro-vias stacked in a staggered configuration, for example, as shown in FIG. 3A. Those skilled in the art will recognize that other configurations may be constructed and other manufacturing processes may be used.

FIGS. 6A and 6B show one embodiment of a connector 600 that may be coupled to a connection region including a group of hybrid via structures on a circuit board. The connector 600 may include a connector body 602 having a front side 604 and a rear side 606. A plurality of signal pins 612 and grounding contacts 614 may extend from the front side 604 of the connector body 602. A plurality of signal pads 620 and grounding pins 640 may extend from the rear side 606 of the connector body 602. The rear side 606 of the connector 600 is configured to be mounted on a circuit board (e.g., on a backplane) and the front side 604 of the connector 600 is configured to be coupled to a mating connector (e.g., on a circuit board to be coupled to the backplane).

The signal pads 620 may be connected to the micro-vias in the hybrid via structures (e.g., micro-vias 320, 322 shown in FIG. 3C). In one embodiment, the signal pads 620 are solderable pads that are soldered to the micro-vias. The grounding pins 640 may be received in and connected to the through-vias in the hybrid via structures (e.g., the through-vias 340, 342 shown in FIG. 3C). In one embodiment, the grounding pins are press fit into the through-vias to provide mechanical strength to the connector 600 coupled to the circuit board.

According to one embodiment, the connector body 602, signal pins 604 and grounding contacts 606 may be configured similar to high speed data transport connectors known to those skilled in the art. Those skilled in the art will recognize that other types of connectors configured for use with a circuit board may also include contact pads and grounding pins configured to be connected to hybrid via structures. Other components (e.g., chip packages or other electronic components) may also include solderable pads and grounding pins for connecting to hybrid via structures on a circuit board.

The hybrid via-structure thus allows the elimination of long stubs that may adversely affect signal integrity, while maintaining a secure mechanical connection to a component or connector. FIG. 7 illustrates one example of a corresponding eye pattern at the receiver side for a 5.0 Gb/s PCI Express Gen2 signal on a channel using hybrid via structures (e.g., as shown in FIG. 3A). As shown, the eye pattern is sufficiently open to comply with the PCI Express Specification.

Figure 8:
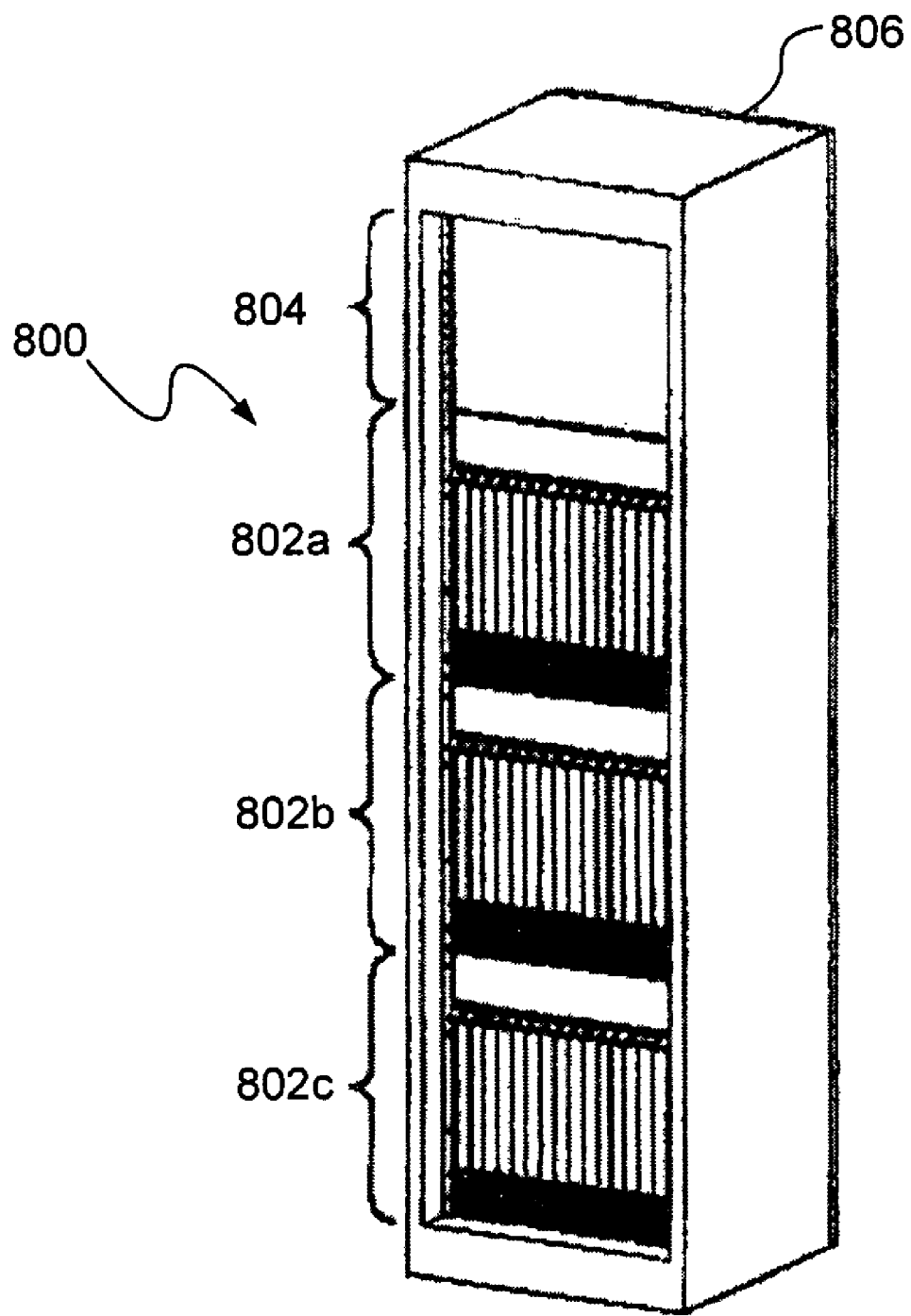
FIG. 8 is a perspective view of a system including a cabinet and a plurality of chassis, consistent with another embodiment of the present disclosure.

Referring to FIG. 8, a system 800 may include a frame or cabinet 806 that accommodates and electrically couples a plurality of shelves or chassis 802*a*, 802*b*, 802*c*. According to one example, a cabinet 806 may be provided by a telecommunications equipment manufacturer (TEM) to house telecommunications equipment. One or more of the chassis 802*a*, 802*b*, 802*c* may include circuit boards including hybrid via structures consistent with any of the embodiments described herein. The cabinet 806 may include, for example, a power supply for providing power to each of the individual chassis 802*a*, 802*b*, 802*c* and other equipment 804 (e.g., alarms, power distribution units, etc.) disposed in the cabinet 806. Additionally, as mentioned above, the cabinet 806 may electrically couple one or more of the chassis 802*a*, 802*b*, 802*c* to at least one other chassis.

According to an alternative embodiment, rather than being disposed in a common cabinet, a system consistent with the present disclosure may include a plurality of chassis that may be individually hardwired to one another without a cabinet. One or more of the plurality of chassis may include circuit boards including hybrid via structures consistent with any embodiment described herein. Additionally, each of the plurality of chassis may be powered by an individual power supply and/or may be separately powered by a common power supply. Such a system may, therefore, provide a greater freedom in the physical arrangement and interrelation of the plurality of chassis.

Consistent with one embodiment, an apparatus includes a plurality of circuit board layers including a plurality of signal layers and at least one reference layer, at least one signal trace located within at least one of the signal layers, and at least one hybrid via structure located in the circuit board and associated with the at least one signal trace. The hybrid via structure may be configured to connect to a component and may include at least one through-via electrically connected to the at least one reference layer and configured to be connected to a pin of the component. The hybrid via structure may also include at least one micro-via electrically connected to the signal trace and configured to be connected to a conductive pad of the component.

Consistent with another embodiment, an apparatus includes at least one circuit board including a plurality of circuit board layers including a plurality of signal layers and at least one reference layer, at least one signal trace located within the at least one of the signal layers, and at least one hybrid via structure located in the circuit board. The hybrid via structure may include at least one through-via electrically connected to the at least one reference layer and at least one micro-via electrically connected to the signal trace. At least one component connected to the circuit board includes at least one grounding pin extending into and electrically connected with the at least one through-via and at least one signal pad contacting and electrically connected to the at least one micro-via.

Consistent with a further embodiment, a system includes a plurality of circuit boards configured to be connected to establish a communication channel. The circuit boards include a plurality of signal layers and at least one reference layer, at least one signal trace located within at least one of the signal layers, and hybrid via structures associated with the signal trace. Each of the hybrid via structures may include at least one through-via electrically connected to the at least one reference layer and at least one micro via electrically connected to the signal trace. At least first and second electronic components are mounted to at least first and second of the circuit boards. The first and second electronic components include at least one grounding pin extending into and electrically connected with the at least one through-via in one of the hybrid via structures and at least one signal pad contacting and electrically connected with the at least one micro-via in one of the hybrid via structures. A plurality of connectors may be mounted to the circuit boards and configured to connect the circuit boards together. The connectors include at least one grounding pin extending into and electrically connected with the at least one through-via and at least one signal pad contacting and electrically connected with the at least one micro-via.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Other modifications, variations, and alternatives are also possible. Accordingly, the claims are intended to cover all such equivalents.

What is claimed is:

1. A system comprising:
   at least one circuit board comprising:
      a plurality of circuit board layers including a plurality of signal layers and at least one reference layer;
      at least one signal trace located within said at least one of said signal layers; and
      at least one hybrid via structure located in said circuit board, said hybrid via structure comprising at least one through-via electrically connected to said at least one reference layer and at least one micro-via electrically connected to said signal trace; and
   at least one component connected to said circuit board, said component comprising at least one grounding pin extending into and electrically connected with said at least one through-via and at least one signal pad contacting and electrically connected to said at least one micro-via.

2. The system of claim 1 wherein said at least one hybrid via structure includes a plurality of hybrid via structures forming a connection region configured to connect to said component.

3. The system of claim 1 wherein said at least one hybrid via structure includes at least first and second hybrid via structures located at first and second ends of said at least one signal trace.

4. The system of claim 1 wherein said at least one signal trace includes a pair of signal traces to support a differential signal pair, and wherein said at least one hybrid structure includes a pair of micro-vias electrically connected to respective ones of said pair of signal traces.

5. The system of claim 1 wherein said at least one micro-via includes a stacked micro-via.

6. The system of claim 4 wherein said differential signal pair supports a data transfer rate of at least about 5 Gb/s.

7. The system of claim 1 wherein said circuit board is a backplane.

8. The system of claim 1 wherein said circuit board is an advanced telecommunications computing architecture (ATCA) backplane.

9. The system of claim 1 wherein said circuit board includes at least eighteen layers, and wherein said at least one signal trace is at least about twenty inches.

10. The system of claim 1 wherein said at least one component includes an electrical connector.

11. The system of claim 1 wherein said at least one component includes an electronic component.

12. The system of claim 1 wherein said at least one component includes at least one electronic component and at least one connector, wherein said at least one hybrid via structure includes at least a first hybrid via structure electrically connected to said at least one electronic component and at least a second hybrid via structure electrically connected to said at least one connector.

13. The system of claim 1 wherein said at least one signal trace includes a pair of signal traces to support a differential signal pair, and wherein said at least one hybrid structure includes a pair of micro-vias electrically connected to respective ones of said pair of signal traces.

14. The system of claim 1 wherein said differential signal pair supports a data transfer rate of at least about 5 Gb/s.

* * * * *